United States Patent
Michigami

(10) Patent No.: US 12,255,631 B2
(45) Date of Patent: Mar. 18, 2025

(54) FILTER DEVICE

(71) Applicant: Murata Manufacturing Co., Ltd., Nagaokakyo (JP)

(72) Inventor: Akira Michigami, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 477 days.

(21) Appl. No.: 17/740,788

(22) Filed: May 10, 2022

(65) Prior Publication Data

US 2022/0271737 A1 Aug. 25, 2022

Related U.S. Application Data

(63) Continuation of application No. PCT/JP2020/042291, filed on Nov. 12, 2020.

(30) Foreign Application Priority Data

Nov. 22, 2019 (JP) .................................. 2019-210991

(51) Int. Cl.
*H03H 9/56* (2006.01)
*H03H 9/54* (2006.01)
(Continued)

(52) U.S. Cl.
CPC ............. *H03H 9/568* (2013.01); *H03H 9/542* (2013.01); *H03H 9/6483* (2013.01); *H03H 9/725* (2013.01)

(58) Field of Classification Search
CPC ...... H03H 9/568; H03H 9/6483; H03H 9/725; H03H 9/542
(Continued)

(56) References Cited

U.S. PATENT DOCUMENTS

2014/0009247 A1 1/2014 Moriya
2016/0126932 A1 5/2016 Nakai et al.
(Continued)

FOREIGN PATENT DOCUMENTS

JP 2014-013959 A 1/2014
JP 2019-022164 A 2/2019
(Continued)

OTHER PUBLICATIONS

Official Communication issued in International Patent Application No. PCT/JP2020/042291, mailed on Dec. 22, 2020.

*Primary Examiner* — Jorge L Salazar, Jr.
(74) *Attorney, Agent, or Firm* — Keating & Bennett, LLP

(57) ABSTRACT

A filter device includes first and second filters respectively having first and second passbands, the second passband being in a frequency range higher than the first passband. The first and second filters are commonly connected to a common terminal. In the first filter, multiple parallel arm resonators define a parallel connection unit in which the parallel arm resonators are connected in parallel with no serial arm resonators interposed therebetween. The parallel arm resonators in the parallel connection unit include first and second parallel arm resonators having anti-resonant frequencies different from each other. In combined impedance-frequency characteristics of the parallel arm resonators in the parallel connection unit, at least one anti-resonant frequency other than a highest anti-resonant frequency is equal to or higher than $2f_{1min} - f_{2min}$ and equal to or lower than $2f_{1max} - f_{2max}$.

20 Claims, 4 Drawing Sheets

(51) Int. Cl.
*H03H 9/64* (2006.01)
*H03H 9/72* (2006.01)

(58) Field of Classification Search
USPC .................. 333/133, 187, 188, 193–196
See application file for complete search history.

(56) References Cited

U.S. PATENT DOCUMENTS

| | | |
|---|---|---|
| 2017/0272057 A1 | 9/2017 | Takata |
| 2017/0294896 A1 | 10/2017 | Nosaka |
| 2019/0028086 A1 | 1/2019 | Takamine |
| 2019/0190491 A1* | 6/2019 | Nosaka .............. H03H 9/14541 |
| 2020/0280301 A1 | 9/2020 | Konaka |

FOREIGN PATENT DOCUMENTS

| | | |
|---|---|---|
| WO | 2014/196245 A1 | 12/2014 |
| WO | 2016/088680 A1 | 6/2016 |
| WO | 2016/117676 A1 | 7/2016 |
| WO | 2019/131501 A1 | 7/2019 |

\* cited by examiner

FILTER DEVICE

CROSS REFERENCE TO RELATED APPLICATIONS

This application claims the benefit of priority to Japanese Patent Application No. 2019-210991 filed on Nov. 22, 2019 and is a Continuation Application of PCT Application No. PCT/JP2020/042291 filed on Nov. 12, 2020. The entire contents of each application are hereby incorporated herein by reference.

BACKGROUND OF THE INVENTION

1. Field of the Invention

The present invention relates to a filter device.

2. Description of the Related Art

Heretofore, filter devices including acoustic wave resonators have been widely used in, for example, cellular phones. Japanese Unexamined Patent Application Publication No. 2019-022164 describes an exemplary multiplexer including acoustic wave resonators. In the multiplexer, multiple band-pass filters including acoustic wave resonators have a common connection to a common terminal. The band-pass filters are a transmit filter and a receive filter for Band 66, a transmit filter and a receive filter for Band 25, and a transmit filter and a receive filter for Band 30.

However, in a filter device as described in Japanese Unexamined Patent Application Publication No. 2019-022164, when interfering waves flow in the common terminal, a signal with third-order distortion occurs in a band-pass filter in the filter device, which may degrade the filter characteristics.

SUMMARY OF THE INVENTION

Preferred embodiments of the present invention provide filter devices which are each able to reduce or prevent third-order distortion caused by interfering waves.

A filter device according to a preferred embodiment of the present invention includes a common terminal, a first filter, and a second filter. The first filter is connected to the common terminal and has a first passband. The second filter is connected to the common terminal and has a second passband in a frequency range higher than the first passband. The first filter includes a serial arm resonator and multiple parallel arm resonators. The parallel arm resonators define a parallel connection unit in which the parallel arm resonators are connected in parallel to each other without the serial arm resonator interposed therebetween. The parallel arm resonators in the parallel connection unit include a first parallel arm resonator and a second parallel arm resonator. The first parallel arm resonator has an anti-resonant frequency different from an anti-resonant frequency of the second parallel arm resonator. In combined impedance-frequency characteristics of the parallel arm resonators in the parallel connection unit, at least one anti-resonant frequency other than a highest anti-resonant frequency is positioned in a frequency band equal to or higher than $2f_{1min} - f_{2min}$ and equal to or lower than $2f_{1max} - f_{2max}$, where $f_{1max}$ represents the frequency at the high end of the first passband, $f_{1min}$ represents the frequency at the low end of the first passband, $f_{2max}$ represents the frequency at the high end of the second passband, and $f_{2min}$ represents the frequency at the low end of the second passband.

Filter devices according to preferred embodiments of the present invention are each able to reduce or prevent third-order distortion caused by interfering waves.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
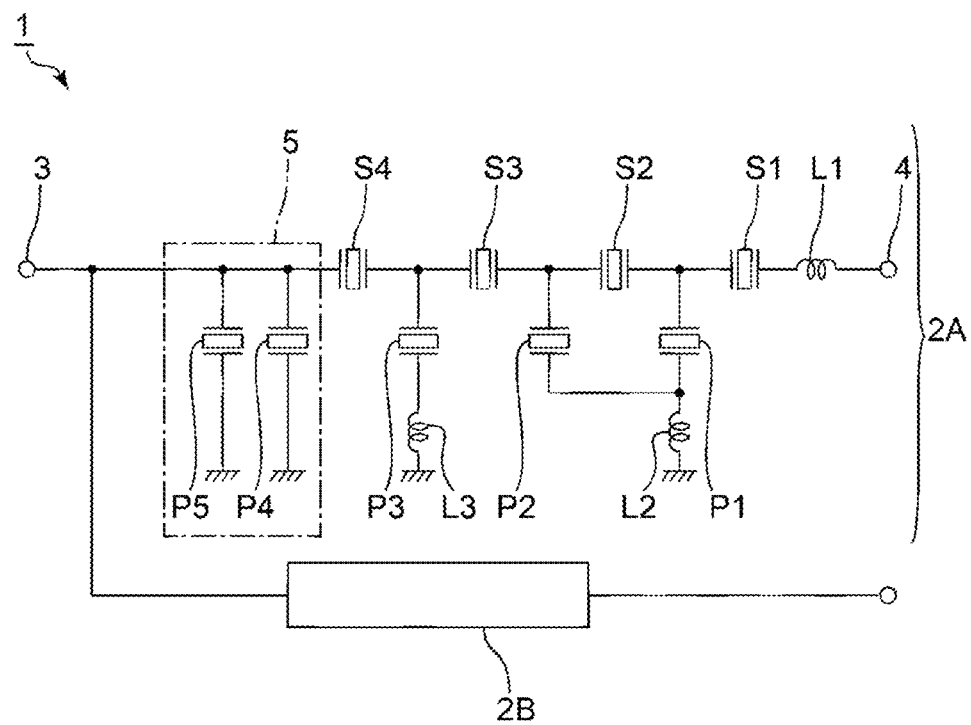
FIG. 1 is a schematic circuit diagram of a filter device according to a first preferred embodiment of the present invention.

Referring to the drawings, preferred embodiments of the present invention will be described below to clarify the present invention.

The preferred embodiments described in the specification are exemplary. Partial replacement or combination of configurations in the different preferred embodiments may be made.

FIG. 1 is a schematic circuit diagram of a filter device according to a first preferred embodiment of the present invention.

A filter device 1 includes a common terminal 3, a first filter 2A, and a second filter 2B. In the present preferred embodiment, the common terminal 3 is connected to an antenna. The first filter 2A and the second filter 2B are commonly connected to the common terminal 3. The first filter 2A is, for example, a transmit filter, and the second filter 2B is, for example, a receive filter. The filter device 1 is, for example, a duplexer. Alternatively, for example, each of the first filter 2A and the second filter 2B may be a transmit filter or may be a receive filter. Both of the first filter 2A and the second filter 2B may be transmit filters or receive filters, for example.

The first filter 2A has a first passband. The first passband is, for example, the transmit band of Band 25 and ranges from about 1850 MHz to about 1915 MHz. The second filter 2B has a second passband. The second passband is, for example, the receive band of Band 25 and ranges from about 1930 MHz to about 1995 MHz. The first passband and the second passband are not limited to those described above. The first passband and the second passband may be any as long as the second passband is in a frequency range higher than the first passband. In the present preferred embodiment, the first passband and the second passband are, for example, passbands of the same communication band. Alternatively, the first passband and the second passband may be passbands of different communication bands.

The first filter 2A includes multiple serial arm resonators and multiple parallel arm resonators. The first filter 2A is, for example, a ladder filter. As illustrated in FIG. 1, the first filter 2A includes a signal terminal 4. The signal terminal 4 and the common terminal 3 may be provided as electrode pads or may be provided as wires, for example.

A serial arm resonator S1, a serial arm resonator S2, a serial arm resonator S3, and a serial arm resonator S4 are connected between the signal terminal 4 and the common terminal 3. A parallel arm resonator P1 is connected between the ground potential and a connecting point between the serial arm resonator S1 and the serial arm resonator S2. A parallel arm resonator P2 is connected between the ground potential and a connecting point between the serial arm resonator S2 and the serial arm resonator S3. A parallel arm resonator P3 is connected between the ground potential and a connecting point between the serial arm resonator S3 and the serial arm resonator S4.

A parallel arm resonator P4 and a parallel arm resonator P5 are connected in parallel to each other between the ground potential and connecting points between the serial arm resonator S4 and the common terminal 3. The parallel arm resonator P4 is an exemplary "first parallel arm resonator". The parallel arm resonator P5 is an exemplary "second parallel arm resonator". Alternatively, the parallel arm resonator P4 may be the "second parallel arm resonator", and the parallel arm resonator P5 may be the "first parallel arm resonator". Any configuration may be used as long as the anti-resonant frequency of the first parallel arm resonator is different from that of the second parallel arm resonator.

The parallel arm resonator P4 and the parallel arm resonator P5 are connected in parallel to each other without a serial arm resonator interposed therebetween. More specifically, no serial arm resonators are disposed between the parallel arm resonator P4 and the parallel arm resonator P5. In the present preferred embodiment, resonators closest to the common terminal 3 in the first filter 2A are the parallel arm resonator P4 and the parallel arm resonator P5. The resonators closest to the common terminal 3 refer to resonators closest to the common terminal 3 in terms of electrical connection.

An inductor L1 is connected between the signal terminal 4 and the serial arm resonator S1. An inductor L2 is connected between the ground potential and the parallel arm resonator P1 and between the ground potential and the parallel arm resonator P2. The end portions, which are located on the ground potential side, of the parallel arm resonator P1 and the parallel arm resonator P2 are commonly connected to the inductor L2. An inductor L3 is connected between the parallel arm resonator P3 and the ground potential. All of the serial arm resonators and the parallel arm resonators in the first filter 2A are acoustic wave resonators. More specifically, the serial arm resonators and the parallel arm resonators in the first filter 2A are surface acoustic wave resonators.

The first filter 2A includes a parallel connection unit 5. The parallel connection unit 5 is a portion including parallel arm resonators connected in parallel to each other with no serial arm resonators interposed therebetween. More specifically, the parallel connection unit 5 according to the present preferred embodiment is a portion including the parallel arm resonator P4 and the parallel arm resonator P5. The parallel connection unit 5 may include three or more parallel arm resonators.

In contrast, the circuit configuration of the second filter 2B is not particularly limited.

The anti-resonant frequency of the parallel arm resonator P4 in the parallel connection unit 5 of the first filter 2A is different from that of the parallel arm resonator P5. More specifically, the anti-resonant frequency of the parallel arm resonator P4 is higher than that of the parallel arm resonator P5.

The frequency at the high end of the first passband is represented by $f_{1max}$, and the frequency at the low end is represented by $f_1$ min. The frequency at the high end of the second passband is represented by $f_{2max}$, and the frequency at the low end is represented by $f_{2min}$. The frequency band equal to or higher than $2f_{1min}-f_{2min}$ and equal to or lower than $2f_{1max}-f_{2max}$ is represented by W0.

During use of the filter device, interfering waves may flow in from the outside. As described above, when interfering waves flow in the filter device, third-order distortion may occur in, for example, the first filter. In the specification, it is assumed that the frequency of interfering waves is positioned in the frequency band W0.

To address this, the filter device 1 according to the present preferred embodiment has the following configurations. 1) The first filter 2A includes the parallel connection unit 5. 2) The multiple parallel arm resonators in the parallel connection unit 5 include the first parallel arm resonator and the second parallel arm resonator having anti-resonant frequencies different from each other. 3) In the combined impedance-frequency characteristics of the parallel arm resonators in the parallel connection unit 5, at least one of the anti-resonant frequencies other than the highest anti-resonant frequency is positioned in the frequency band W0 equal to or higher than $2f_{1min}-f_{2min}$ and equal to or lower than $2f_{1max}-f_{2max}$. These configurations enable reduction or prevention of third-order distortion caused by interfering waves. The details of this will be described below.

Figure 2:
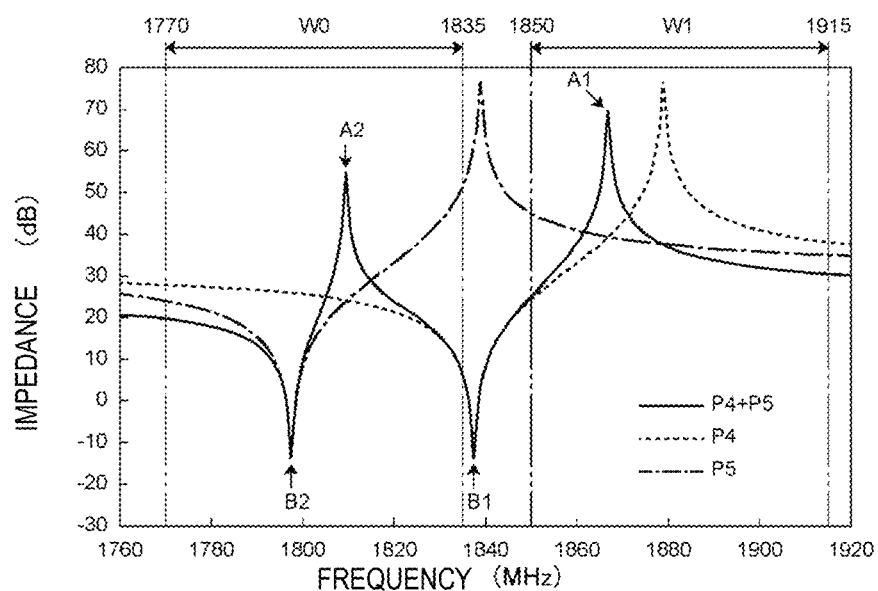
FIG. 2 is a diagram illustrating the impedance-frequency characteristics of each parallel arm resonator of a parallel connection unit and the combined impedance-frequency characteristics of the parallel arm resonators of the parallel connection unit, according to the first preferred embodiment of the present invention.
Figure 3:
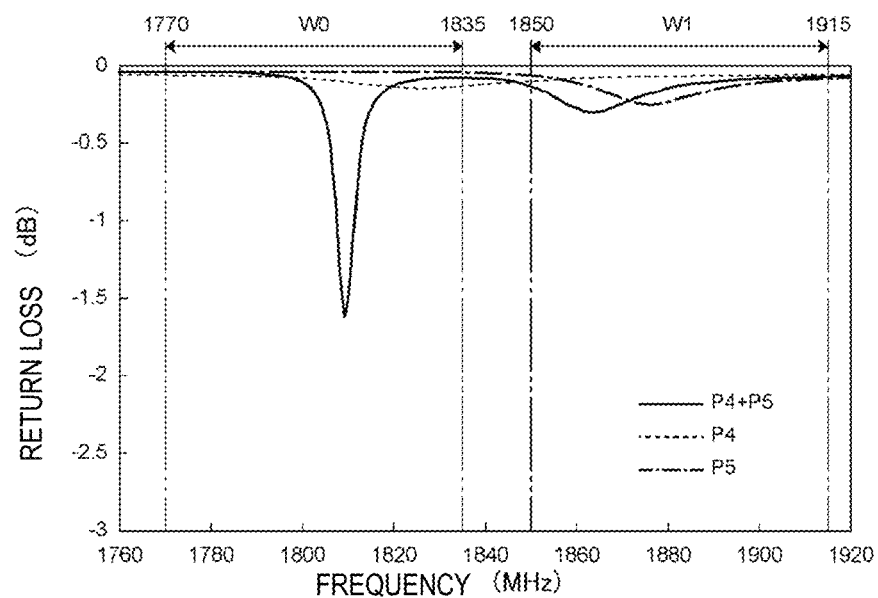
FIG. 3 is a diagram illustrating the return loss of each parallel arm resonator of a parallel connection unit and the combined return loss, as reflection characteristics, of the parallel arm resonators of the parallel connection unit, according to the first preferred embodiment of the present invention.

FIG. 2 is a diagram illustrating the impedance-frequency characteristics of each parallel arm resonator of the parallel connection unit and the combined impedance-frequency characteristics of the parallel arm resonators of the parallel connection unit, according to the first preferred embodiment. FIG. 3 is a diagram illustrating the return loss of each parallel arm resonator of the parallel connection unit and the combined return loss, as reflection characteristics, of the parallel arm resonators of the parallel connection unit, according to the first preferred embodiment. In FIGS. 2 and 3, the frequency band W1 is the first passband. In FIGS. 2 and 3, the combined characteristics of the parallel arm resonator P4 and the parallel arm resonator P5 are illustrated by a solid line, the characteristics of the parallel arm resonator P4 are illustrated by a dashed line, the characteristics of the parallel arm resonator P5 are illustrated by a long dashed short dashed line. The difference in resonant frequency between the parallel arm resonator P4 and the parallel arm resonator P5 is, for example, about 40 MHz, and the difference in anti-resonant frequency is, for example, also about 40 MHz.

In the combined impedance-frequency characteristics, illustrated in FIG. 2, of the parallel arm resonator P4 and the parallel arm resonator P5 of the parallel connection unit 5, there are two anti-resonance points indicated by arrow A1 and arrow A2 and two resonance points indicated by arrow B1 and arrow B2. The frequencies at the two resonance points indicated by arrow B1 and arrow B2 match or substantially match the frequencies at the resonance points of the parallel arm resonator P4 and the parallel arm resonator P5, respectively. In contrast, the anti-resonance points indicated by arrow A1 and arrow A2 are positioned at respective frequencies at which the impedance of the parallel arm resonator P4 matches or substantially matches that of the parallel arm resonator P5.

The reason for this is as follows. Typically, an acoustic wave resonator is inductive in the frequency band between its resonant frequency and its anti-resonant frequency and is capacitive outside the frequency band. Therefore, at the points which are indicated by arrow A1 and arrow A2 and at which the impedances of the two parallel arm resonators match or substantially match each other, the imaginary component of the impedance is equal or substantially equal to zero. At a point at which the imaginary component of impedance is equal or substantially equal to zero, the impedance has a maximum value and defines an anti-resonance point.

As illustrated in FIG. 2, the anti-resonance point indicated by arrow A1 is positioned between the resonant frequency and the anti-resonant frequency of the parallel arm resonator P4. The anti-resonance point indicated by arrow A2 is positioned between the resonant frequency and the anti-resonant frequency of the parallel arm resonator P5. The anti-resonance point indicated by arrow A1 is positioned in the frequency band W1 which is the first passband. Thus, the parallel arm resonators of the parallel connection unit 5 provide the first passband. As illustrated in FIG. 3, the absolute value of the return loss in the first passband is extremely small, with almost no influence being exerted on the filter characteristics of the filter device 1.

In contrast, as illustrated in FIG. 2, the anti-resonance point indicated by arrow A2 is also positioned in the frequency band W0. Thus, as illustrated in FIG. 3, the absolute value of the combined return loss, as reflection characteristics, of the parallel arm resonator P4 and the parallel arm resonator P5 is large in the frequency band W0. As described above, the frequency band W0 indicates the frequency range of interfering waves. In the first preferred embodiment, the absolute value of the return loss in the frequency band W0 is large, enabling effective reduction or prevention of interfering waves flowing in the parallel arm resonators in the parallel connection unit 5. Therefore, third-order distortion, caused by interfering waves, in the first filter 2A may be effectively reduced or prevented. This also enables effective reduction or prevention of an influence, which is exerted by the third-order distortion, on the second filter 2B which, along with the first filter 2A, is commonly connected to the common terminal 3.

The frequency at the anti-resonance point indicated by arrow A2 may be adjusted through the resonant frequency or the capacitance of each parallel arm resonator in the parallel connection unit 5. Therefore, at any frequency in the frequency band W0, interfering waves flowing in, as described above, may be effectively reduced or prevented. In the specification, the frequency at an anti-resonance point and an anti-resonant frequency refer to the same frequency.

As a parallel arm resonator is closer to the common terminal 3, it is easier for interfering waves from the outside to flow in the parallel arm resonator, and it is easier for third-order distortion to occur in the parallel arm resonator. In contrast, in the present preferred embodiment, the parallel arm resonator P4 and the parallel arm resonator P5 of the parallel connection unit 5 are resonators closest to the common terminal 3 in the first filter 2A. Therefore, third-order distortion caused by interfering waves may be more effectively reduced or prevented, and the influence, which is exerted by the third-order distortion, on the second filter 2B may be more effectively reduced or prevented.

Figure 4:
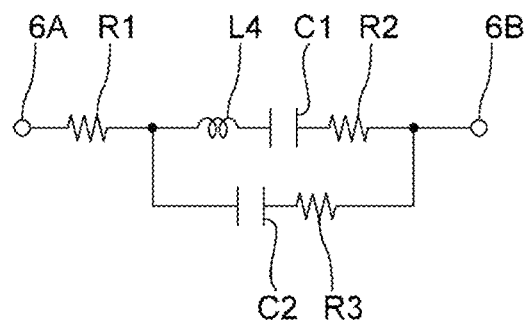
FIG. 4 is a circuit diagram of an equivalent circuit of a parallel arm resonator according to the first preferred embodiment of the present invention.

Specifically, the equivalent circuit of a parallel arm resonator illustrated in FIG. 4 is used to show the characteristics of the parallel arm resonator P4 in FIGS. 2 and 3. The same is true for the characteristics of the parallel arm resonator P5. In the equivalent circuit illustrated in FIG. 4, a first resistive element R1 is connected between a first terminal 6A and a second terminal 6B. A first element group and a second element group are connected in parallel to each other between the first resistive element R1 and the second terminal 6B. In the first element group, an inductor L4, a first capacitive element C1, and a second resistive element R2 are connected in series to each other in this sequence from the first resistive element R1 side. In the second element group, a second capacitive element C2 and a third resistive element R3 are connected in series to each other from the first resistive element R1 side. Each of the first resistive element R1, the second resistive element R2, and the third resistive element R3 has a resistance of, for example, about 0.1Ω. The inductor L4 has an inductance of, for example, about 75 nH. The first capacitive element C1 has a capacitance of, for example, about 0.1 pF. The second capacitive element C2 has a capacitance of, for example, about 2.2 pF. The parameters of the elements are not limited to those described above.

The combined impedance-frequency characteristics illustrated in FIG. 2 may be measured in, for example, such a manner that measurement probes come into contact with both of the respective end portions of the parallel connection unit. Both of the end portions of the parallel connection unit refer to both of the nodes to which the parallel arm resonators of the parallel connection unit are commonly connected. The method of measuring the combined impedance-frequency characteristics of a common connection unit is not limited to the method described above.

As described above, in the filter device 1, both of the first passband and the second passband are passbands of Band 25, for example. Thus, in the present preferred embodiment, the first passband and the second passband are passbands of the same communication band but are not limited thereto. The first passband and the second passband may be passbands of different communication bands. In this case, both of the first passband and the second passband are preferably high passbands, middle passbands, or low passbands. This enables the anti-resonant frequency of the parallel arm resonator P5 in the parallel connection unit 5 to be suitably disposed in the frequency band W0. Therefore, third-order distortion caused by interfering waves may be suitably reduced or prevented. In the specification, a high passband refers to a band equal to or higher than about 2300 MHz and equal to or lower than about 2700 MHz. A middle passband refers to a band equal to or higher than about 1400 MHz and equal to or lower than about 2200 MHz. A low passband is a band equal to or higher than about 600 MHz and equal to or lower than about 1000 MHz.

When the first passband and the second passband are passbands of the same communication band, the communication band is not limited to Band 25. For example, the communication band may be Band 3, Band 7, or Band 66.

The parallel connection unit may include three or more parallel arm resonators connected in parallel to each other with no serial arm resonators interposed therebetween. In this case, any configuration may be used as long as the anti-resonant frequency of at least one of the parallel arm resonators in the parallel connection unit is different from that of another parallel arm resonator in the parallel connection unit. In addition, any configuration may be used as long as, in the combined impedance-frequency characteristics of the parallel arm resonators in the parallel connection unit, at least one of the anti-resonant frequencies other than the highest anti-resonant frequency is positioned in the frequency band W0.

Figure 5:
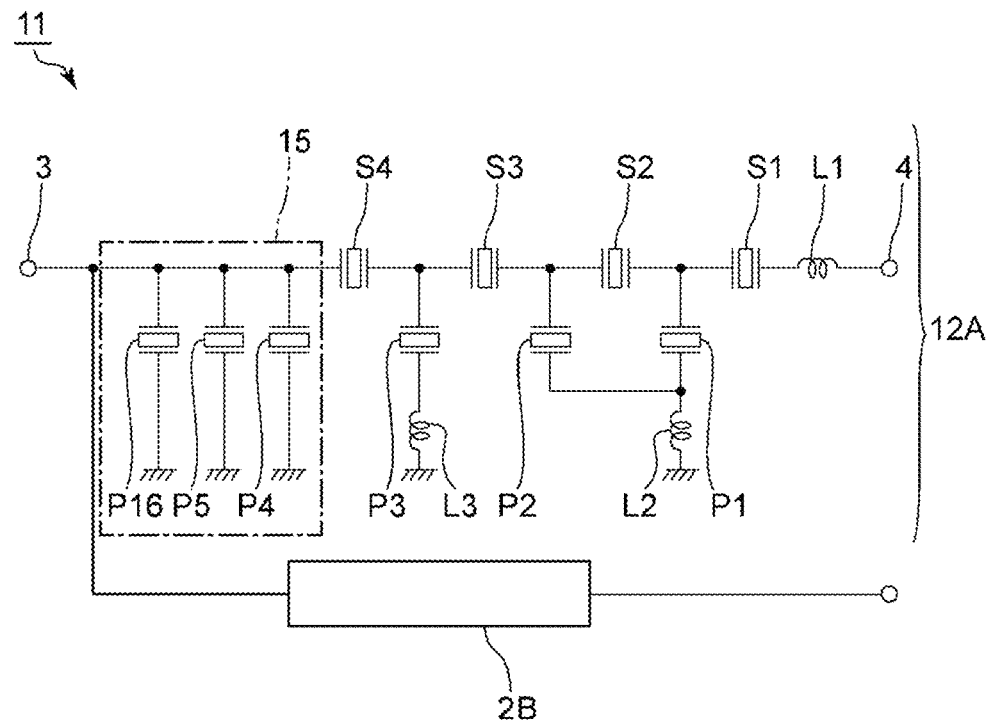
FIG. 5 is a schematic circuit diagram of a filter device according to a second preferred embodiment of the present invention.

FIG. 5 is a schematic circuit diagram of a filter device according to a second preferred embodiment of the present invention.

The present preferred embodiment is different from the first preferred embodiment in that a parallel connection unit 15 includes three parallel arm resonators. Other than the point described above, a filter device 11 according to the present preferred embodiment has the same or substantially the same configuration as that of the filter device 1 in the first preferred embodiment.

In the parallel connection unit 15, the parallel arm resonator P4, the parallel arm resonator P5, and a parallel arm resonator P16 are connected in parallel to each other with no serial arm resonators interposed in between. The parallel arm resonator P16 is an exemplary "third parallel arm resonator". The anti-resonant frequency of the third parallel arm resonator is different from that of the first parallel arm resonator and that of the second parallel arm resonator. As in the first preferred embodiment, the parallel arm resonator P4 of the filter device 11 is an exemplary first parallel arm resonator. The parallel arm resonator P5 is an exemplary second parallel arm resonator. Thus, the anti-resonant frequencies of the parallel arm resonator P4, the parallel arm resonator P5, and the parallel arm resonator P16 are different from each other. In the present preferred embodiment, the anti-resonant frequency of the parallel arm resonator P4 is the highest in the parallel connection unit 15, and the anti-resonant frequency of the parallel arm resonator P16 is the lowest. The anti-resonant frequency of the parallel arm resonator P5 is a frequency between the anti-resonant frequency of the parallel arm resonator P4 and that of the parallel arm resonator P16.

Figure 6:
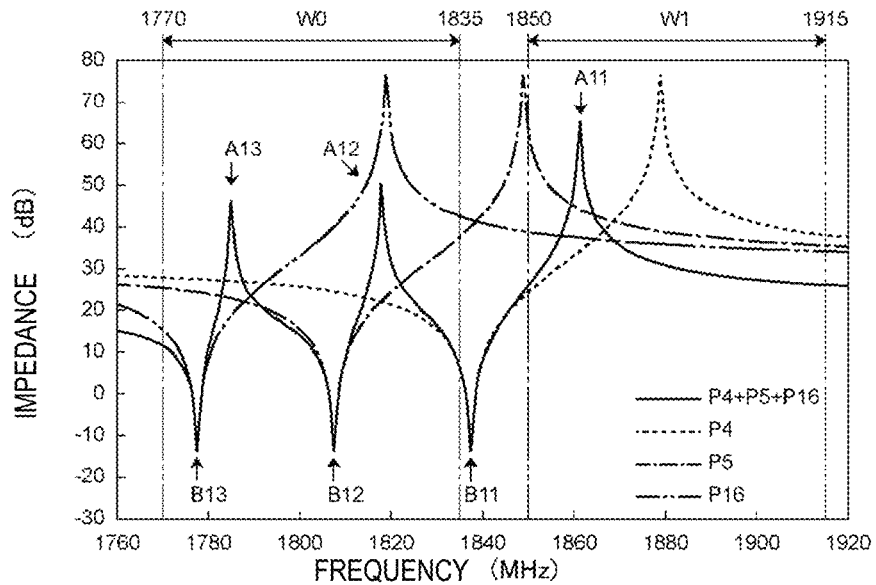
FIG. 6 is a diagram illustrating the impedance-frequency characteristics of each parallel arm resonator of a parallel connection unit and the combined impedance-frequency characteristics of the parallel arm resonators of the parallel connection unit, according to the second preferred embodiment of the present invention.
Figure 7:
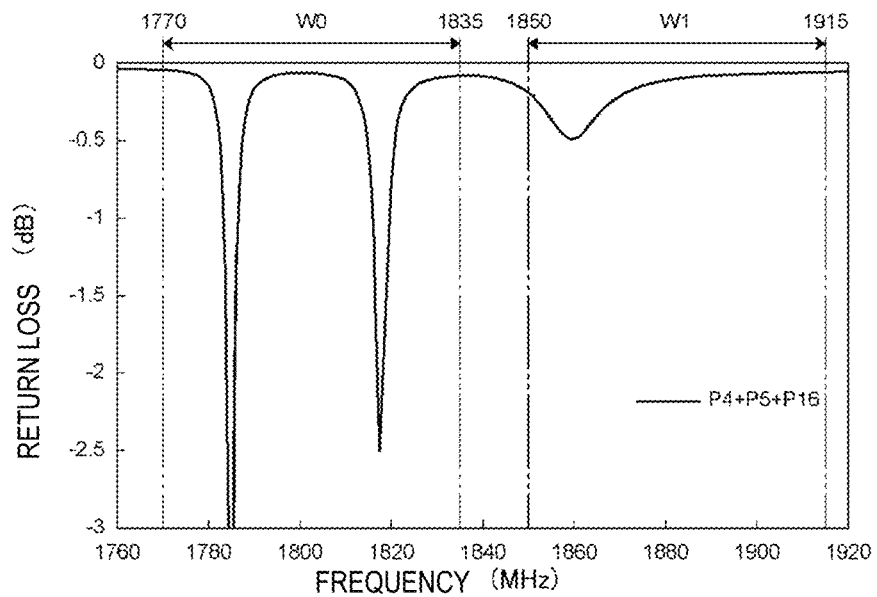
FIG. 7 is a diagram illustrating the combined return loss, as reflection characteristics, of the parallel arm resonators of a parallel connection unit according to the second preferred embodiment of the present invention.

FIG. 6 is a diagram illustrating the impedance-frequency characteristics of each parallel arm resonator of the parallel connection unit and the combined impedance-frequency characteristics of the parallel arm resonators of the parallel connection unit, according to the second preferred embodiment. FIG. 7 is a diagram illustrating the combined return loss, as reflection characteristics, of the parallel arm resonators of the parallel connection unit according to the second preferred embodiment. In FIGS. 6 and 7, the combined characteristics of the parallel arm resonator P4, the parallel arm resonator P5, and the parallel arm resonator P16 are illustrated by a solid line, the characteristics of the parallel arm resonator P4 are illustrated by a dashed line, the characteristics of the parallel arm resonator P5 are illustrated by a long dashed short dashed line, the characteristics of the parallel arm resonator P16 are illustrated by a long dashed double-short dashed line. The difference in resonant frequency between the parallel arm resonator P4 and the parallel arm resonator P5 is, for example, about 30 MHz, and the difference in anti-resonant frequency is also, for example, about 30 MHz. The difference in resonant frequency between the parallel arm resonator P5 and the parallel arm resonator P16 is, for example, about 30 MHz, and the difference in anti-resonant frequency is also, for example, about 30 MHz.

As illustrated in FIG. 6, the anti-resonance point indicated by arrow A11 in the combined impedance-frequency characteristics is positioned between the resonant frequency and the anti-resonant frequency of the parallel arm resonator P4. The anti-resonance point indicated by arrow A12 is positioned between the resonant frequency and the anti-resonant frequency of the parallel arm resonator P5. The anti-resonance point indicated by arrow A13 is positioned between the resonant frequency and the anti-resonant frequency of the parallel arm resonator P16. The frequency at the anti-resonance point indicated by A11 is a frequency at which the imaginary component of the impedance is equal or substantially equal to zero due to the parallel arm resonator P4, which is inductive, and the parallel arm resonator P5 and the parallel arm resonator P16, which are capacitive. The frequency at the anti-resonance point indicated by A12 is a frequency at which the imaginary component of the impedance is equal or substantially equal to zero due to the parallel arm resonator P5 and the parallel arm resonator P16, which are inductive, and the parallel arm resonator P4, which is capacitive. The frequency at the anti-resonance point indicated by A13 is a frequency at which the imaginary component of the impedance is equal or substantially equal to zero due to the parallel arm resonator P16, which is inductive, and the parallel arm resonator P4 and the parallel arm resonator P5, which are capacitive.

Among the anti-resonance points indicated by arrow A11, arrow A12, and arrow A13, the anti-resonance point indicated by arrow A11 is positioned at the highest frequency. The anti-resonance point indicated by arrow A11 is positioned in the frequency band W1 which is the first passband. Thus, the parallel arm resonators of the parallel connection unit 15 provide the first passband.

As illustrated in FIG. 7, it was discovered that the absolute value of the combined return loss, as reflection characteristics, of the parallel arm resonator P4, the parallel arm resonator P5, and the parallel arm resonator P16 is large in the frequency band W0. More specifically, in the present preferred embodiment, the absolute value of the return loss is large in the frequency band W0, and there are two extremal frequencies. Thus, interfering waves flowing in the parallel arm resonators in the parallel connection unit 15 may be effectively reduced or prevented in a wide frequency band effectively. Therefore, third-order distortion caused by interfering waves may be effectively reduced or prevented in a wide frequency band, and the influence, exerted by the third-order distortion, on the second filter 2B may be effectively reduced or prevented.

In the present preferred embodiment, there are three anti-resonant frequencies in the combined impedance-frequency characteristics of the parallel arm resonators in the parallel connection unit 15. For example, the anti-resonant frequency of the parallel arm resonator P16 may be the same as that of the parallel arm resonator P4 or the parallel arm resonator P5. In this case, two anti-resonant frequencies are present in the combined impedance-frequency characteristics of the parallel arm resonators in the parallel connection unit 15 as in the first preferred embodiment. Therefore, also in this case, as in the first preferred embodiment, the parallel arm resonators of the parallel connection unit 15 provide the first passband, and third-order distortion caused by interfering waves may be reduced or prevented.

As described above, the parallel connection unit may include three or more parallel arm resonators connected in parallel to each other with no serial arm resonators interposed in between. In this case, the parallel connection unit preferably includes the third parallel arm resonator. The anti-resonant frequency of the third parallel arm resonator is different from that of the first parallel arm resonator and that of the second parallel arm resonator. In addition, in the combined impedance-frequency characteristics of the parallel arm resonators in the parallel connection unit, at least two of the anti-resonant frequencies other than the highest anti-resonant frequency are preferably positioned in the frequency band W0. This enables third-order distortion, which is caused by interfering waves, to be effectively reduced or prevented in a wide frequency band.

In the first preferred embodiment and the second preferred embodiment, an example in which the filter device is a duplexer is described. Alternatively, the filter device of the present invention may be a multiplexer.

Figure 8:
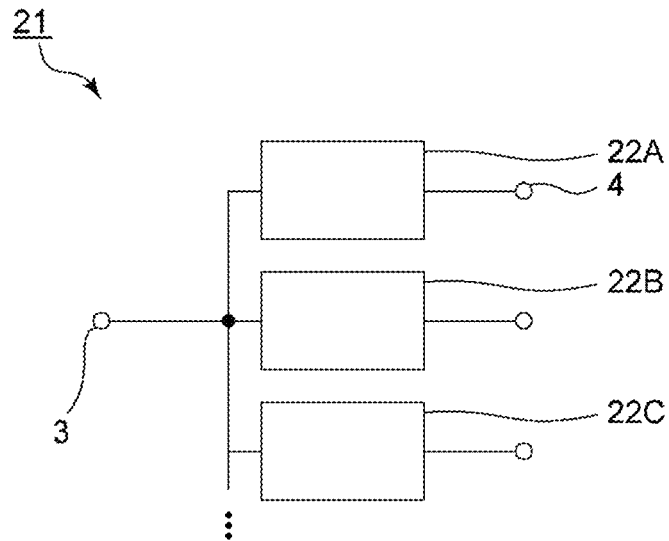
FIG. 8 is a schematic diagram illustrating a filter device according to a third preferred embodiment of the present invention.

FIG. 8 is a schematic diagram of a filter device according to a third preferred embodiment of the present invention.

A filter device 21 according to the present preferred embodiment is a multiplexer. The filter device 21 includes a first filter 22A, a second filter 22B, and a third filter 22C. The first filter 22A, the second filter 22B, and the third filter 22C are commonly connected to the common terminal 3.

The first filter 22A has the same or substantially the same configuration as that of the first filter according to the first preferred embodiment or the second preferred embodiment. The circuit configuration of the second filter 22B and the third filter 22C is not particularly limited. Each of the first filter 22A, the second filter 22B, and the third filter 22C may be a transmit filter or may be a receive filter, for example.

The filter device 21 also includes multiple filters other than the first filter 22A, the second filter 22B, and the third filter 22C. The multiple filters also are commonly connected to the common terminal 3. In the case where the filter device 21 is a multiplexer, the number of filters that are commonly connected to the common terminal 3 is not particularly limited.

The filter device 21 according to the present preferred embodiment, which includes the first filter 22A which is the same or substantially the same as the first filter in the first preferred embodiment or the second preferred embodiment, may effectively reduce or prevent third-order distortion caused by interfering waves. Therefore, the influence, which is exerted by the third-order distortion, on the other filters which, along with the first filter 22A, are commonly connected to the common terminal 3 may be effectively reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
   a common terminal;
   a first filter connected to the common terminal and having a first passband; and
   a second filter connected to the common terminal and having a second passband in a frequency range higher than the first passband; wherein
   the first filter includes a serial arm resonator and a plurality of parallel arm resonators;
   the plurality of parallel arm resonators define a parallel connection unit in which the plurality of parallel arm resonators are connected in parallel to each other without the serial arm resonator interposed therebetween;
   the plurality of parallel arm resonators in the parallel connection unit include a first parallel arm resonator and a second parallel arm resonator, the first parallel arm resonator having an anti-resonant frequency different from an anti-resonant frequency of the second parallel arm resonator; and
   in combined impedance-frequency characteristics of the plurality of parallel arm resonators in the parallel connection unit, at least one anti-resonant frequency other than a highest anti-resonant frequency is in a frequency band equal to or higher than $2f_{1min}-f_{2min}$ and equal to or lower than $2f_{1max}-f_{2max}$, where $f_{1max}$ represents a frequency at a high end of the first passband, $f_{1min}$ represents a frequency at a low end of the first passband, $f_{2max}$ represents a frequency at a high end of the second passband, and $f_{2min}$ represents a frequency at a low end of the second passband.

2. The filter device according to claim 1, wherein the plurality of parallel arm resonators of the parallel connection unit include a resonator closest to the common terminal in the first filter.

3. The filter device according to claim 2, wherein, in the combined impedance-frequency characteristics of the plurality of parallel arm resonators in the parallel connection unit of the first filter, the highest anti-resonant frequency is in the first passband.

4. The filter device according to claim 2, wherein
   the parallel connection unit of the first filter further includes a third parallel arm resonator having an anti-resonant frequency, the anti-resonant frequency of the third parallel arm resonator being different from the anti-resonant frequency of the first parallel arm resonator and the anti-resonant frequency of the second parallel arm resonator; and
   in the combined impedance-frequency characteristics of the plurality of parallel arm resonators in the parallel connection unit of the first filter, at least two of the anti-resonant frequencies other than the highest anti-resonant frequency are positioned in the frequency band equal to or higher than $2f_{1min}-f_{2min}$ and equal to or lower than $2f_{1max}-f_{2max}$.

5. The filter device according to claim 2, wherein the first filter is a transmit filter and the second filter is a receive filter.

6. The filter device according to claim 2, wherein both of the first passband and the second passband are equal to or higher than about 2300 MHz and equal to or lower than about 2700 MHz.

7. The filter device according to claim 2, wherein both of the first passband and the second passband are equal to or higher than about 1400 MHz and equal to or lower than about 2200 MHz.

8. The filter device according to claim 2, wherein both of the first passband and the second passband are equal to or higher than about 600 MHz and equal to or lower than about 1000 MHz.

9. The filter device according to claim 2, wherein the first passband and the second passband are passbands of a same communication band.

10. The filter device according to claim 1, wherein, in the combined impedance-frequency characteristics of the plurality of parallel arm resonators in the parallel connection unit of the first filter, the highest anti-resonant frequency is in the first passband.

11. The filter device according to claim 10, wherein
the parallel connection unit of the first filter further includes a third parallel arm resonator having an anti-resonant frequency, the anti-resonant frequency of the third parallel arm resonator being different from the anti-resonant frequency of the first parallel arm resonator and the anti-resonant frequency of the second parallel arm resonator; and
in the combined impedance-frequency characteristics of the plurality of parallel arm resonators in the parallel connection unit of the first filter, at least two of the anti-resonant frequencies other than the highest anti-resonant frequency are positioned in the frequency band equal to or higher than $2f_{1min}-f_{2min}$ and equal to or lower than $2f_{1max}-f_{2max}$.

12. The filter device according to claim 10, wherein the first filter is a transmit filter and the second filter is a receive filter.

13. The filter device according to claim 10, wherein both of the first passband and the second passband are equal to or higher than about 2300 MHz and equal to or lower than about 2700 MHz.

14. The filter device according to claim 10, wherein both of the first passband and the second passband are equal to or higher than about 1400 MHz and equal to or lower than about 2200 MHz.

15. The filter device according to claim 1, wherein
the parallel connection unit of the first filter further includes a third parallel arm resonator having an anti-resonant frequency, the anti-resonant frequency of the third parallel arm resonator being different from the anti-resonant frequency of the first parallel arm resonator and the anti-resonant frequency of the second parallel arm resonator; and
in the combined impedance-frequency characteristics of the plurality of parallel arm resonators in the parallel connection unit of the first filter, at least two of the anti-resonant frequencies other than the highest anti-resonant frequency are positioned in the frequency band equal to or higher than $2f_{1min}-f_{2min}$ and equal to or lower than $2f_{1max}-f_{2max}$.

16. The filter device according to claim 1, wherein the first filter is a transmit filter and the second filter is a receive filter.

17. The filter device according to claim 1, wherein both of the first passband and the second passband are equal to or higher than about 2300 MHz and equal to or lower than about 2700 MHz.

18. The filter device according to claim 1, wherein both of the first passband and the second passband are equal to or higher than about 1400 MHz and equal to or lower than about 2200 MHz.

19. The filter device according to claim 1, wherein both of the first passband and the second passband are equal to or higher than about 600 MHz and equal to or lower than about 1000 MHz.

20. The filter device according to claim 1, wherein the first passband and the second passband are passbands of a same communication band.

* * * * *